United States Patent [19]
Song et al.

[11] Patent Number: 6,115,311
[45] Date of Patent: Sep. 5, 2000

[54] SEMICONDUCTOR MEMORY DEVICE CAPABLE OF SELECTING A PLURALITY OF REFRESH CYCLE MODES

[75] Inventors: Ho-Sung Song, Suwon; Jong-Hyun Choi, Yongin; Jun-Young Jyun, Seoul, all of Rep. of Korea

[73] Assignee: Samsung Electronics, Co., Ltd., Suwon, Rep. of Korea

[21] Appl. No.: 09/000,979

[22] Filed: Dec. 30, 1997

[30] Foreign Application Priority Data

Dec. 30, 1996 [KR] Rep. of Korea ............ 96-76739

[51] Int. Cl.[7] .................................................. G11C 7/00
[52] U.S. Cl. ....................... 365/222; 365/193; 365/194; 365/225.7
[58] Field of Search .................................. 365/222, 194, 365/193, 225.7

[56] References Cited

U.S. PATENT DOCUMENTS 5,867,442  2/1999  Kim et al. ........................ 365/226

*Primary Examiner*—Andrew Q. Tran
*Attorney, Agent, or Firm*—Marger Johnson & McCollom, P.C.

[57] ABSTRACT

A semiconductor memory device having an improved column select control circuit. The semiconductor memory device includes a memory cell array consisting of a plurality of volatile memory cells and a column select line decoder for selecting a column line of the memory cell array. The semiconductor memory device includes at least two different refresh cycle modes designed within a single chip. A mode select circuit generates a mode select signal for selecting one of at least two refresh modes. A column select control circuit controls the enable time of the column select line decoder enable signal responsive to the mode select signal and to row address strobe signal for providing the column select line decoder enable signal to the column select line decoder.

17 Claims, 4 Drawing Sheets

SEMICONDUCTOR MEMORY DEVICE CAPABLE OF SELECTING A PLURALITY OF REFRESH CYCLE MODES

BACKGROUND OF THE INVENTION

1. Field of the Invention

The present invention relates to a semiconductor memory device circuit and, more particularly, to a column select control circuit in a semiconductor memory device which controls the column select line enable time according to the selected refresh mode.

2. Description of the Related Art

Generally, a volatile semiconductor memory device such as a dynamic random access memory (DRAM) stores data by accumulating a charge in the capacitor of a memory cell. DRAM devices are widely used in data processing systems. DRAM devices include circuits for reading the data stored in the memory cell by amplifying the memory cell signal and recharging the memory cell before the data is lost due to leakage currents in the cell capacitor. The process of recharging the memory cell is termed refresh.

Moreover, DRAM devices having faster operating speeds are highly desirable. In order to obtain faster DRAM devices, it is necessary to reduce the access time by reducing the transition interval of the row address strobe signal access time tRAC. So long as the data sensing operation is not affected by ensuring the minimum charge sharing and sensing intervals between the memory cell and the corresponding bit line, increasing the speed of the row address strobe signal access time tRAC leads to higher DRAM operating speeds.

The trend in the semiconductor memory device industry is for devices that have higher integration, lower power consumption, faster operating speeds, multiple functions, and configurability such that a single device can meet the various demands of system designers. In certain instances, many modes are designed on one chip, each mode capable of selection by a simple subsequent process. One widely used method of selecting among a variety of modes is through the use of fuses. The desired mode is selected by fuse trimming just before the die goes through the package assembly process. However, problems arise when many modes are designed on one chip. For example, a 4K refresh mode has a better sensing performance than a 1K refresh mode because the former has a remarkably smaller power to ground voltage (VCC/VSS) noise ratio. Therefore, the row address strobe signal access time tRAC can be improved by enabling the column select line (CSL) sooner in the 4K refresh mode. However, the conventional design does not vary the column select path when either the 1K or 4K refresh mode is selected. Therefore, the speed of the row address strobe signal access time tRAC is the same for both the 4K and tie 1K refresh modes. In other words, even though the 4K refresh mode can improve the speed of the row address strobe signal access time tRAC, the row address strobe signal access time tRAC has the same speed in both the 1K and 4K refresh modes. This problem is even more severe in the 8K refresh mode becoming one of the primary reasons for dissatisfaction among system designers and users.

Consequently, the speed of the row address strobe signal access time tRAC is not improved even though various refresh modes having improved speeds are provided on one chip because the column select line is enabled through the same column select enable path for all of the refresh modes.

SUMMARY OF THE INVENTION

It is an object of the present invention to overcome the problems associated with the prior art.

It is another object of the present invention to provide a semiconductor memory device having a column select control circuit which overcomes the problems associated with the prior art.

It is yet another object of the present invention to provide a column select control circuit for a semiconductor memory device which controls the column select line enable time according to the selected refresh mode.

In accordance with one aspect of the present invention, a semiconductor memory device having a memory cell array consisting of a plurality of volatile memory cells, a column select line decoder for selecting a column line of the memory cell array, and at least two different refresh cycle modes designed within a single device. The semiconductor memory device further includes a mode select circuit for generating a mode select signal, the mode select signal selecting one of the at least two refresh modes, and a column select control circuit for enabling a column select line decoder enable signal responsive to the mode select signal and a row address strobe signal.

DETAILED DESCRIPTION OF THE PREFERRED EMBODIMENT

In the preferred embodiment of the present invention, it is assumed that a 1K refresh mode and a 4K refresh mode are designed on the same DRAM chip and that the desired mode is selected by fuse trimming before the die goes through the package assembly process. It will be apparent to one skilled in the art, however, that the present invention is not limited to this specific example. It is possible to apply the present invention to other similar semiconductor memory devices as well as DRAM devices and other modes may be used in addition to the 1K and 4K refresh modes.

Figure 1:
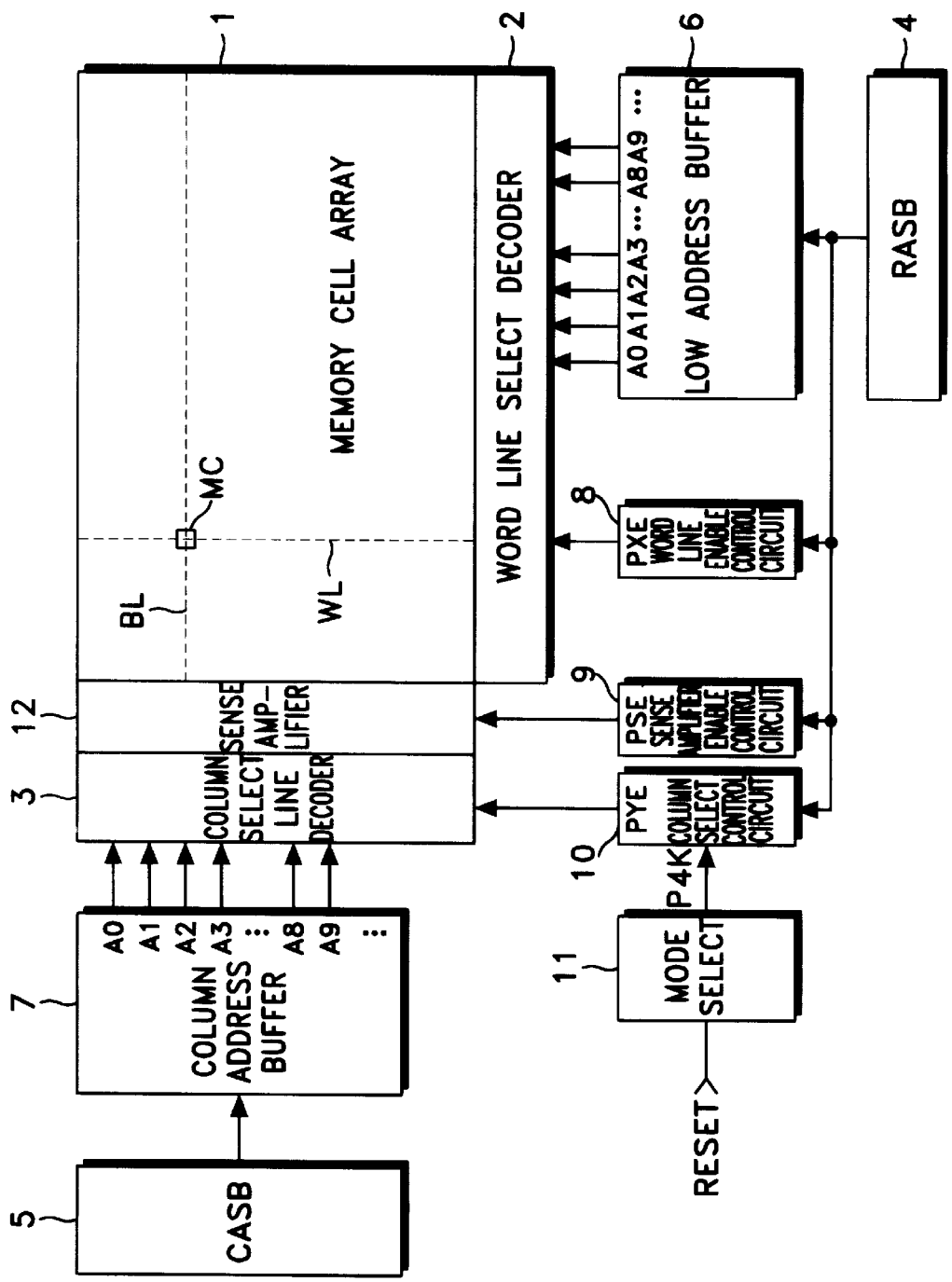
FIG. 1 is a block diagram of a semiconductor memory device having a column select control circuit according to the present invention.

FIG. 1 is a block diagram of a semiconductor memory device having a column select control circuit according to the present invention. The memory (device includes memory cell array 1, word line select decoder 2, sense amplifier 12, column select line decoder 3, row address strobe buffer 4, column address strobe buffer 5, row address buffer 6, column address buffer 7, word line enable control circuit 8, sense amplifier enable control circuit 9, column select control circuit 10, and mode select circuit 11.

Memory cell array 1 has a plurality of memory cells MC formed at a plurality of intersecting points of word line WL and bit line BL. Memory cell MC includes a storage capacitor (not shown) for storing an electric charge and an access transistor (not shown) having a drain-source channel connected between one plate of the storage capacitor and the bit line and having a gate connected to the word line. Each memory cell MC is accessed by the enabled word line WL. The electric charge stored in the storage capacitor is transferred to sense amplifier 12 through the bit line BL when memory cell MC is read. Word line select decoder 2 decodes a row address responsive to enable control signal PXE delayed by row address strobe signal RASB. One word line is selected and enabled at a time by a row decoding signal generated from word line select decoder 2. Column select line decoder 3 decodes a column address responsive to column select line decoder enable signal PYE delayed by row address strobe signal RASB. A column line CSL is selected by a column decoding signal generated from column select line decoder 3 thereby generating sensing data from the sense amplifier (not shown) connected to the corresponding bit line BL. Row address strobe buffer 4 converts the externally-applied row address strobe signal RASB having a TTL level into a signal having a CMOS level. The level-converted row address strobe signal RASB is then used as a master signal for selecting the word line and determining the operating enable time of each operating mode. Column address strobe buffer 5 converts an externally-applied column address strobe signal CASB having a TTL level into a signal having a CMOS level. The level-converted column address strobe signal CASB is then used as a master signal for selecting the bit line connected to the column line and determining the operating enable time of each operating mode.

Row address buffer 6 receives the row address which selects the appropriate word lines responsive to row address strobe signal RASB and supplies a buffered row address to word line select decoder 2. Column address buffer 7 receives the column address which selects the appropriate column line responsive to column address strobe signal CASB and supplies a buffered column address to column select line decoder 3. Word line enable control circuit 8 and generates enable control signal PXE for enabling word line select decoder 2 responsive to row address strobe signal RASB. The word line enable time is determined by enable control signal PXE. Sense amplifier enable control circuit 9 generates sense amplifier enable signal PSE for enabling sense amplifier 12 responsive to row address strobe signal RASB. The bit line sensing time is determined by sense amplifier enable signal PSE. Column select control circuit 10 generates column select line decoder enable signal PYE for enabling the column select line decoder 3 responsive to row address strobe signal RASB. According to decoder enable signal PYE, data sensed by sense amplifier 12 is generated through the column line. If at least two refresh cycle modes are provided on one chip, mode select circuit 11 supplies a mode select signal P4K for selecting one of the two modes to column select control circuit 10.

High speed improved performance is obtained by controlling the column select line enable time according to the selected refresh mode by block mode select circuit 11 and column select control circuit 10.

Figure 2:
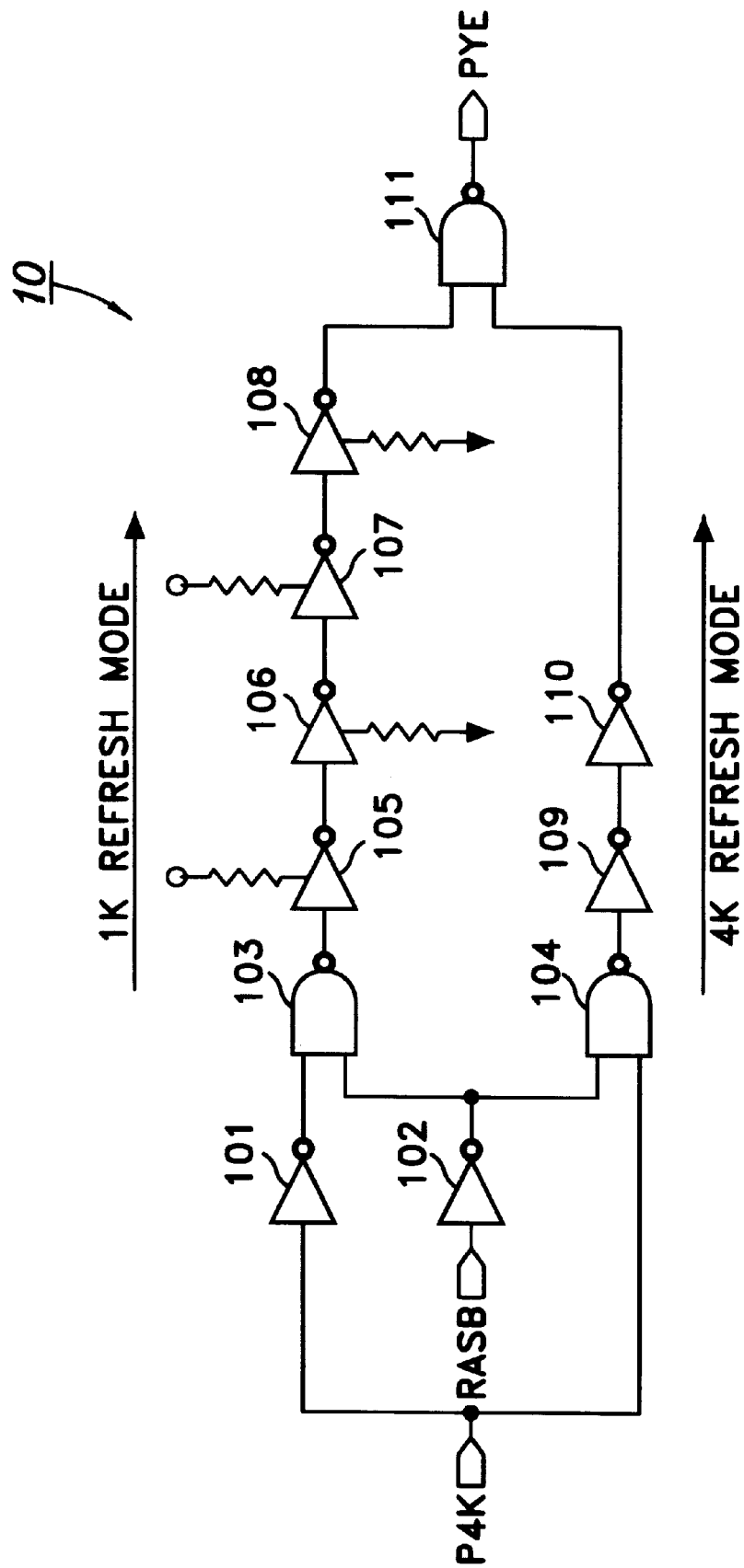
FIG. 2 is a detailed circuit diagram of column select control circuit 10 shown in FIG. 1.

FIG. 2 is a detailed diagram of column select control circuit 10 shown in FIG. 1. Select control circuit 10 includes a first delay chain 200 and a second delay chain 202. First delay chain 200 includes four serially connected inverters 105, 106, 107, and 108 and NAND gate 103. Second delay chain 202 includes two serially connected inverters 109 and 110 and NAND gate 104. Inverter 101 receives mode select signal P4K and provides an inverted mode select signal to an input of NAND 103. Inverter 102 receives row address strobe signal RASB and provides an inverted version of the row address strobe signal RASB to NAND gates 103 and 104. NAND gate 111 receives the delayed signal output from first and second delay chains 200 and 202 and outputs column select control signal PYE.

Figure 3:
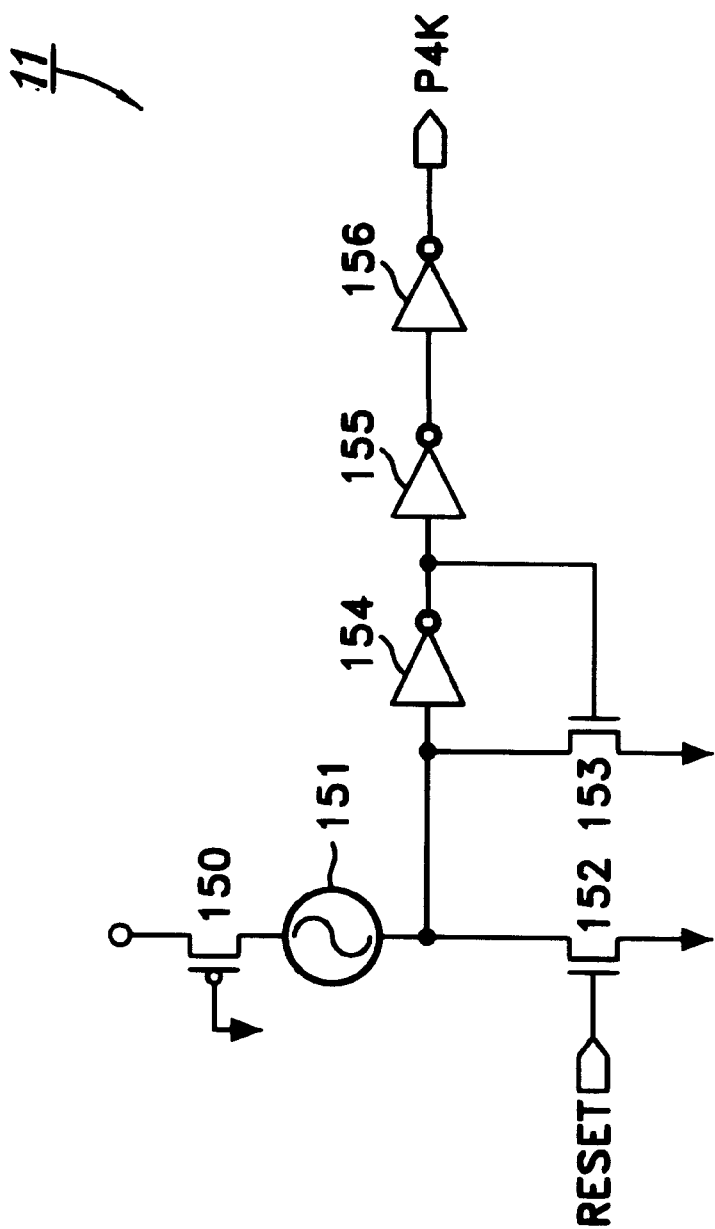
FIG. 3 is a detailed circuit diagram of mode select circuit 11 shown in FIG. 1.

FIG. 3 is a block diagram of mode select circuit 11 shown in FIG. 1. Mode select circuit 11 includes a fuse 151, PMOS transistor 150, NMOS transistors 152 and 153, and inverters 154, 155, and 156. Fuse 151 is connected to the source of PMOS transistor 150. PMOS transistor 150 has a gate connected to ground and a source is connected to a power voltage supply. A RESET signal is provided to the gate of NMOS transistor 152. NMOS transistor 153 is connected in parallel to NMOS transistor 152 with the gate of NMOS transistor 153 connected to the output of inverter 154. Inverters 154, 155, and 156 are serially connected.

Figure 4:
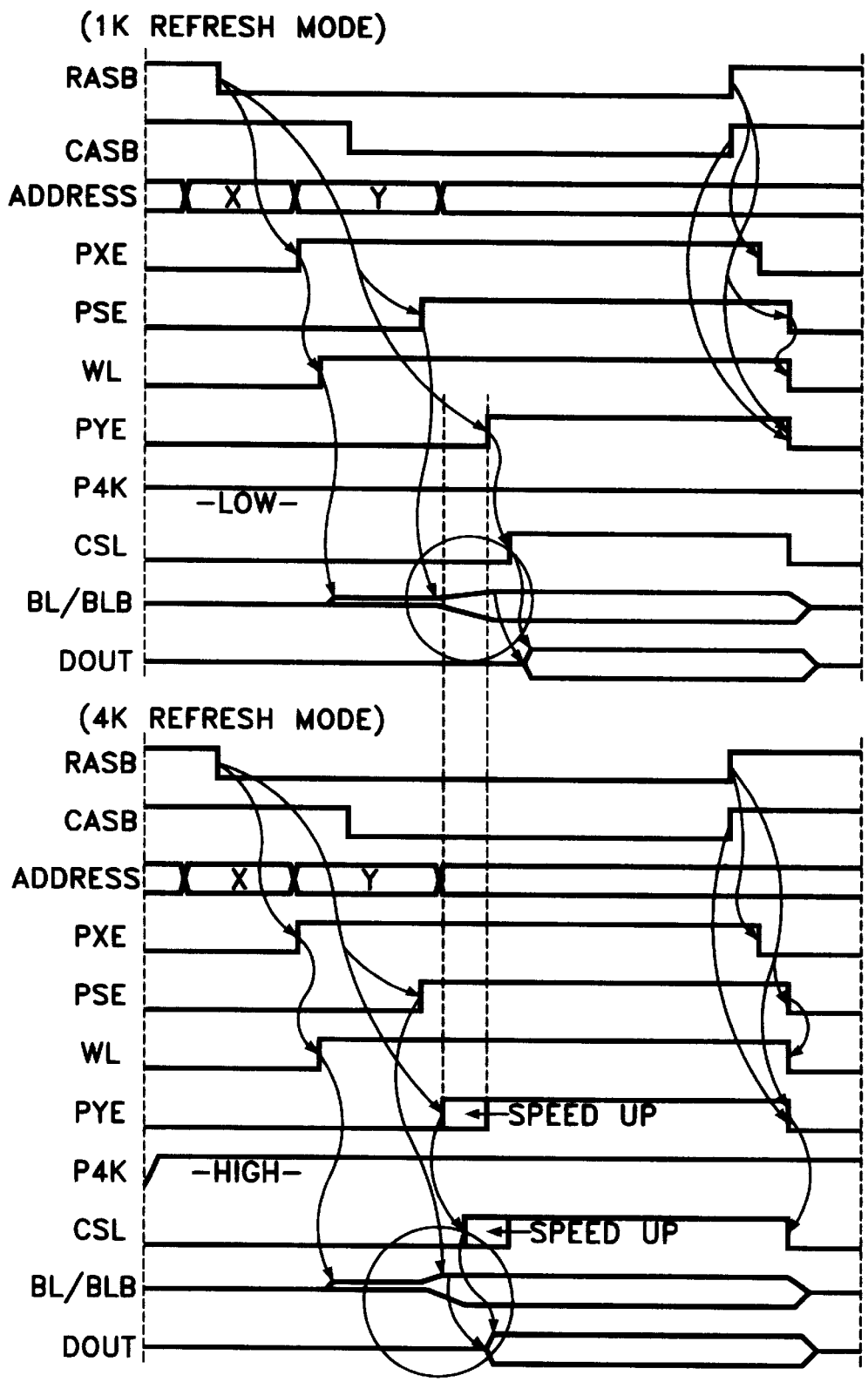
FIG. 4 is an operational timing diagram of the 1K and 4K refresh modes according to the present invention.

FIG. 4 is an operational timing diagram of 1K and 4K refresh cycle modes. As shown in FIG. 4, the enable time of column select line CSL in the 4K refresh mode is faster than the enable time of column select line CSL in the 1K refresh mode by an interval T. The increased performance is achieved by column select control circuit 10 shown in FIG. 2. When the memory device of FIG. 1 is designed to select between 1K and 4K refresh modes, fuse 151 shown in FIG. 3 is cut if the 4K refresh mode is selected. Fuse 151 is an element of polysilicon material and may be blown through laser cutting or by applying a high voltage. Thus, a power voltage provided through PMOS transistor 150 is separated from a node N1. A reset signal RESET applied to the gate of NMOS transistor 152 is changed to a logic "LOW" from a logic "HIGH" when the power voltage is supplied. Therefore, the output of inverter 154 is set to a logic "HIGH" and the output of inverter 155 is set to a logic "LOW." The output of inverter 156 then changes to a logic "HIGH." Mode select signal P4K is output from inverter 156. If the 4K refresh mode is selected, mode select signal P4K is at a logic "HIGH" level. If the 1K mode is selected, mode select signal P4K of inverter 156 appears as a logic "LOW" level signal because fuse 151 is not cut or trimmed. When the 4K mode is selected, mode select signal P4K is supplied to inverter 101 at a logic "HIGH" and to one input of NAND gate 104 as shown in FIG. 2.

Referring to FIG. 2, column select control circuit 10 includes a plurality of delay chains like delay chains 200 and 202 having different time delays. After row address strobe signal RASB is enabled, column select control circuit 10 selects one of the delay chains 200 or 202 responsive to mode select signal P4K thereby generating column select line decoder enable signal PYE. There are two delay chains 200 and 202 shown in the present example: delay line 200 is related to the 1K refresh mode and delay line 202 is related to the 4K refresh mode. If the 4K mode is selected, the mode select signal P4K is at a logic "HIGH" and the output of NAND gate 104 is at a logic "LOW." The output of inverter 109 is set to a logic "HIGH" and the output of inverter 110 is set to a logic "LOW." The output of NAND gate 111 is set to a logic "HIGH" irrespective of the logic state of the other input. Consequently, column select line decoder enable signal PYE is generated having a logic "HIGH." Since delay chain 202 of the 4K refresh mode includes only two inverters and thus decreased delay, column select line decoder enable signal PYE is generated sooner than if delay chain 200 of the 1K refresh mode is used. The decreased delay results in the speedup effect corresponding to the interval T indicated in FIG. 4. If the 1K refresh mode is selected, column select line decoder enable signal PYE is generated through four inverters 105, 106, 107, and 108 resulting in an increase in speed when compared to delay chain 202. Therefore, if the larger of two refresh modes is selected, improved speed performance of column select line decoder enable signal PYE is achieved, controlling the column select line CSL enable time and improving overall performance.

As mentioned above, the enable time of the column select line is adjusted according to the selected refresh mode. If the larger of the two refresh modes is selected, row address strobe signal access time tRAC is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device having a memory cell array including a plurality of volatile memory cells, a column select line decoder for selecting a column line of the memory cell array, and at least two refresh cycle modes provided within a single device, the semiconductor memory device comprising:

a mode select circuit for generating a mode select signal, the mode select signal selecting one of the at least two refresh modes; and a column select control circuit coupled to the mode select circuit for enabling a column select line decoder enable signal responsive to the mode select signal.

2. The semiconductor memory device of claim 1 wherein the column select control circuit has a plurality of internal delay paths, each internal delay path having a corresponding delay time, the column select control circuit enabling the column select line decoder enable signal by delaying a row address strobe signal by one of the plurality of internal delay paths responsive to the mode select signal.

3. The semiconductor memory device of claim 2 wherein the mode select circuit includes a fuse for determining a logic state of the mode select signal.

4. The semiconductor memory device of claim 2 wherein the refresh cycle modes are 1K, 2K, 4K, and 8K.

5. A semiconductor memory device having at least two different refresh cycle modes, comprising:

a mode select circuit for generating a mode select signal, the mode select circuit selecting one of the at least two refresh modes; and a column select control circuit coupled to the mode select circuit having at least two delay chains, each delay chain having a different time delay, the column select control circuit selecting one of the at least two delay chains responsive to the mode select signal.

6. The semiconductor memory device of claim 5 wherein the mode select circuit includes a fuse for determining the mode select signal.

7. The semiconductor memory device of claim 6 wherein the fuse is blown for selecting one of the at least two refresh modes.

8. The semiconductor memory device of claim 5 wherein the column select control circuit selects one of the at least two delay chains responsive to a row address strobe signal.

9. The semiconductor memory device of claim 5 wherein the column select control circuit includes a first and a second delay chain, the first delay chain having a delay longer than the second delay chain.

10. The semiconductor memory device of claim 9 wherein the first delay chain includes four serially connected inverters and the second delay chain includes two serially connected inverters.

11. The semiconductor memory device of claim 5 wherein the at least two refresh cycle modes includes 1K, 2K, 4K, and 8K refresh cycle modes.

12. A method for generating a column select line decoder enable signal in a semiconductor memory device having at least two refresh cycles, comprising:

selecting one of the at least two refresh cycles;

generating a mode select signal according to the selected one of the at least two refresh cycles;

selecting one of at least two delay paths responsive to the mode select signal; and generating the column select line decoder enable signal by delaying a row address strobe signal through the selected one of the at least two delay paths.

13. The method of claim 12 wherein selecting one of the at least two refresh cycles includes selecting one refresh cycle among 1K, 2K, 4K, and 8K refresh cycles.

14. The method of claim 12 wherein generating the mode select signal includes trimming a fuse.

15. The method of claim 12 wherein selecting one of the at least two delay paths includes selecting one of the at least two delay paths responsive to the row address strobe signal.

16. The method of claim 14 wherein selecting one of the at least two delay paths includes selecting between delay paths having different delays.

17. The method of claim 16 wherein delaying the row address strobe signal includes delaying the row address strobe signal through the selected one of the delay paths.

* * * * *

UNITED STATES PATENT AND TRADEMARK OFFICE
CERTIFICATE OF CORRECTION

PATENT NO.  : 6,115,311
DATED       : September 5, 2000
INVENTOR(S) : Song et al.

It is certified that error appears in the above-identified patent and that said Letters Patent is hereby corrected as shown below:

Column 1,
Line 52, "tie 1K refresh modes" should read -- the 1K refresh modes --.

Column 2,
Line 49, "memory (device" should read -- memory device --.

Signed and Sealed this

Twelfth Day of March, 2002

Attest:

Attesting Officer

JAMES E. ROGAN
Director of the United States Patent and Trademark Office